United States Patent [19]

Momohara

[11] Patent Number: 5,525,912
[45] Date of Patent: Jun. 11, 1996

[54] PROBING EQUIPMENT AND A PROBING METHOD

[75] Inventor: Tomomi Momohara, Yokohama, Japan

[73] Assignee: Kabushiki Kaisha Toshiba, Tokyo, Japan

[21] Appl. No.: 401,571

[22] Filed: Mar. 9, 1995

[30] Foreign Application Priority Data

Mar. 10, 1994 [JP] Japan ...................................... 6-039585

[51] Int. Cl.⁶ ..................................................... G01R 1/02
[52] U.S. Cl. .............................. 324/754; 324/73.1; 437/8; 382/199; 439/482; 414/222
[58] Field of Search ..................................... 324/754, 73.1; 437/2, 8, 3, 4, 5; 439/482; 414/222, 225, 749

[56] References Cited

U.S. PATENT DOCUMENTS 5,254,939 10/1993 Anderson et al. ...................... 324/754

FOREIGN PATENT DOCUMENTS 55-130137 10/1980 Japan .

OTHER PUBLICATIONS

G. A. Perone, "The Economics of the Memory Tester Decision", IEEE Catalog No. 81CH1693-1, 1981 International Test Conference Oct. 1981.

Primary Examiner—Kenneth A. Wieder
Assistant Examiner—Barry C. Bowser
Attorney, Agent, or Firm—Loeb & Loeb

[57] ABSTRACT

A wafer prober comprises a wafer chuck for chucking a wafer and a probe card holding section for holding two or more probe cards. The wafer prober further comprises a test section for simultaneously testing a plurality of chips among chips in one wafer, with use of the two or more probe cards, while respectively making probe sections included in the two or more probe cards be in contact with external terminal sections of the plurality of chips.

11 Claims, 9 Drawing Sheets

PROBING EQUIPMENT AND A PROBING METHOD

BACKGROUND OF THE INVENTION

1. Field of the Invention

The present invention relates to a probing equipment and a probing method, and particularly, to a probing equipment and a method thereof suitable for simultaneously testing a plurality of chips.

2. Description of the Related Art

In recent days, the diameter of a wafer has been enlarged to allow a greater yield of chip per wafer. Further, the memory capacitance of a semiconductor memory device, e.g. a DRAM or an EEPROM, has been exclusively increased, and accordingly, a time required for testing a chip has become longer.

In the situation as stated above, a multi-probing method of measuring a plurality of chips in one test has been introduced, in order to shorten the processing time.

The above multi-probing method uses a plurality of probe groups provided in a probe card so that a plurality of chips can be tested and processed.

The multi-probing method stated above is disclosed in Jpn. Pat. Appln. KOKAI Publication No. 55-130137.

However, the number of external terminals used in a semiconductor chip tends to increase as the function of a semiconductor has been complicated. The number of probes equipped on one probe card has almost been close to a maximum value. Therefore, it is difficult to expect a much more improved processing ability from the multi-probing method.

As a result, a multi-test-station method has nearly been practiced in which a plurality of test stations are equipped to improve the processing ability, in contrast to the multi-probing method which uses only one test station.

A test station consists of a wafer chuck for chucking a wafer and a retaining portion for retaining a probe card. If a plurality of test stations are connected to a main body of a test equipment, a plurality of wafers can be processed at once. In this multi-test-station method, the number of chips which can simultaneously be subjected to measurement can be increased since the number of test stations can be increased.

The multi-test-station method is disclosed in "THE ECONOMICS OF THE MEMORY TESTER DECISION", 1981 INTERNATIONAL TEST CONFERENCE, p348, p349, and p366.

However, since a plurality of test stations are used, the entire equipment is expensive and the price is not so reasonable in view of the processing ability.

As has been explained above, improvements in the processing ability cannot be expected from a probing equipment using the multi-probing method.

Although a probing equipment using the multi-test-station method attains an improved processing ability, it is expensive and the price is not suitable in view of the processing ability.

SUMMARY OF THE INVENTION

The present invention has an object of providing a probing equipment and a probing method having a high processing ability at a low price.

In order to achieve the above object, an aspect according to the present invention comprises a wafer chucking device for chucking a semiconductor wafer, a probe card holding device for holding two or more probe cards, a test device for simultaneously testing a plurality of chips formed in each of the wafers with use of the two or more prove cards, while making probing sections respectively included in the two or more probe cards be in contact with external terminal sections respectively provided in the chips.

Another aspect according to the present invention is characterized in that the probe card holding device adjusts independently positions of the probe cards from each other, in X-, Y-, and θ-directions.

The probing equipment and the probing method having the structure as stated above is designed so as to test one wafer with use of two or more probe cards, the number of chips to be simultaneously tested can be increased even when the number of probes to be equipped in one card is restricted due to some reasons. Therefore, the processing time required for testing chips can be reduced while improving the processing ability.

According to the equipment constructed in the above structure, the number of chips to be simultaneously tested is increased much more than in a conventional equipment using a multi-test-station method, even if the number of test stations is increased in both equipment. Therefore, the processing ability of the equipment according to the present invention is high in relation to the price.

Further, since the present invention is arranged such that the probe card retaining device independently adjusts positions of the probe cards, in X-, Y-, and θ-directions, fine adjustments can be performed for every probe card, so that the proving sections of the equipment can be aligned with the external terminal sections of the chips with high precision.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE PREFERRED EMBODIMENTS

In the following, embodiments of the present invention will be explained with reference to drawings.

Figure 1:
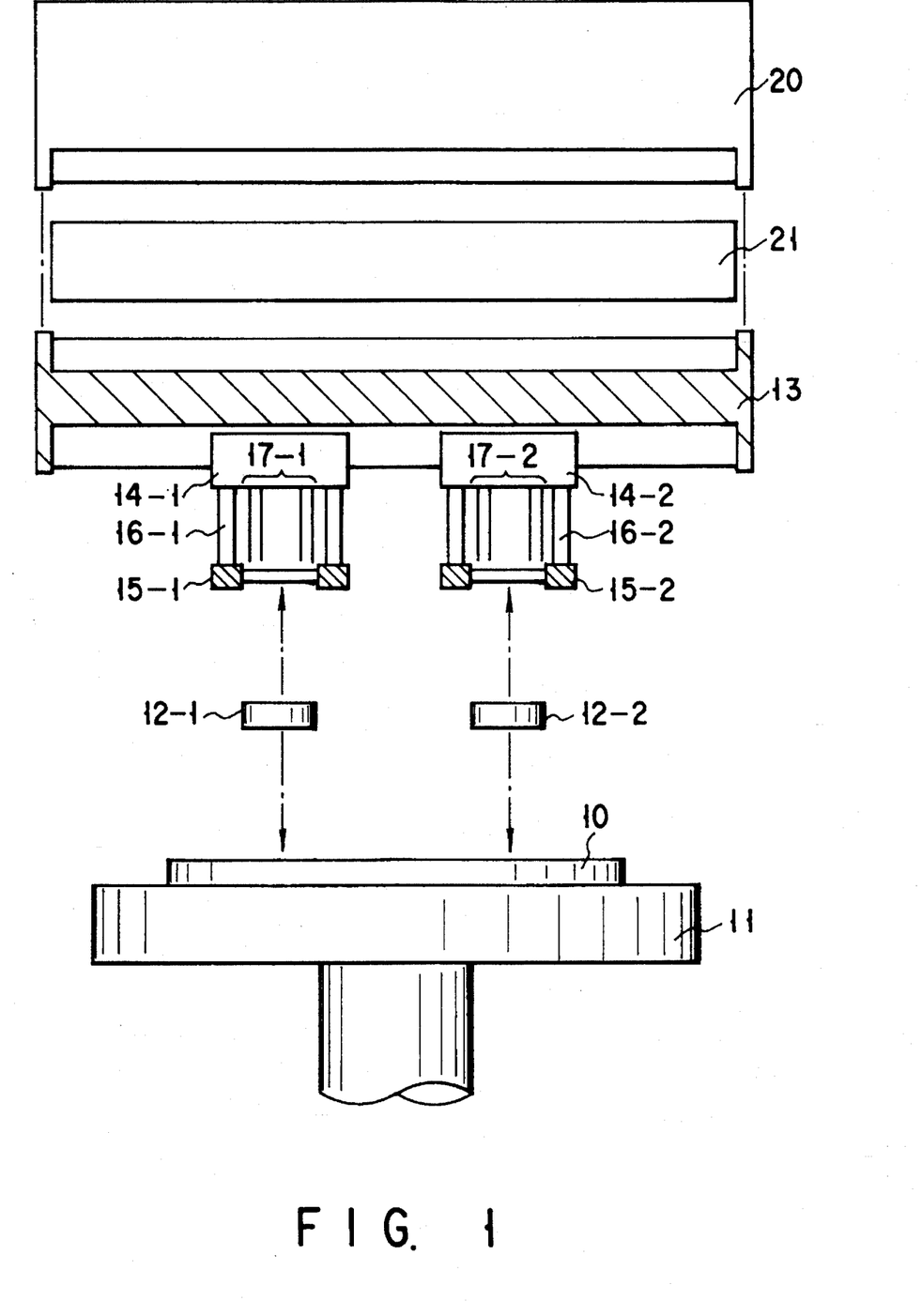
FIG. 1 is a view sowing the structure of a probing equipment according to an embodiment of the present invention.

FIG. 1 is a view showing the structure of a probing equipment according to an embodiment of the present invention.

The structure of the equipment will first be explained.

As shown in FIG. 1, a wafer chuck 11 for chucking a wafer 10 is provided, and a card holding section 13 for holding two probe cards 12-1 and 12-2 is provided above the wafer chuck 11. Two card installation sections 14-1 and 14-2 are provided at a position of the card holding section 1] facing the chuck 11, such that the card installation sections 14-1 and 14-2 can be independently moved in X- and Y-directions. Further, the installation sections 14-1 and 14-2 are respectively provided with an insert ring 15-1 for holding a card 12-1 and an insert ring 15-2 for holding a card 12-2. The insert rings 15-1 and 15-2 are respectively secured on the installation sections 14-1 and 14-2 by supporting columns 16-1 and 16-2. The insert rings 15-1 and 15-2 can respectively be moved (or rotated) in the θ-direction in relation to the installation sections 14-1 and 14-2. The installation sections 14-1 and 14-2. The installation sections 14-1 and 14-2 are provided with pin groups 17-1 and 17-2 which are brought into electric contact with terminals of the cards 12-1 and 12-2. Between the holding section 13 and a main body of a test equipment 20, a sheet of wiring board 21 is inserted which brings the pin groups 17-1 and 17-2 into electric contact with the main body 20. The wiring board 21 can be replaced with a board or the like having a different wiring pattern, so that one probing equipment can apply to various types of LSI chips.

Figure 2:
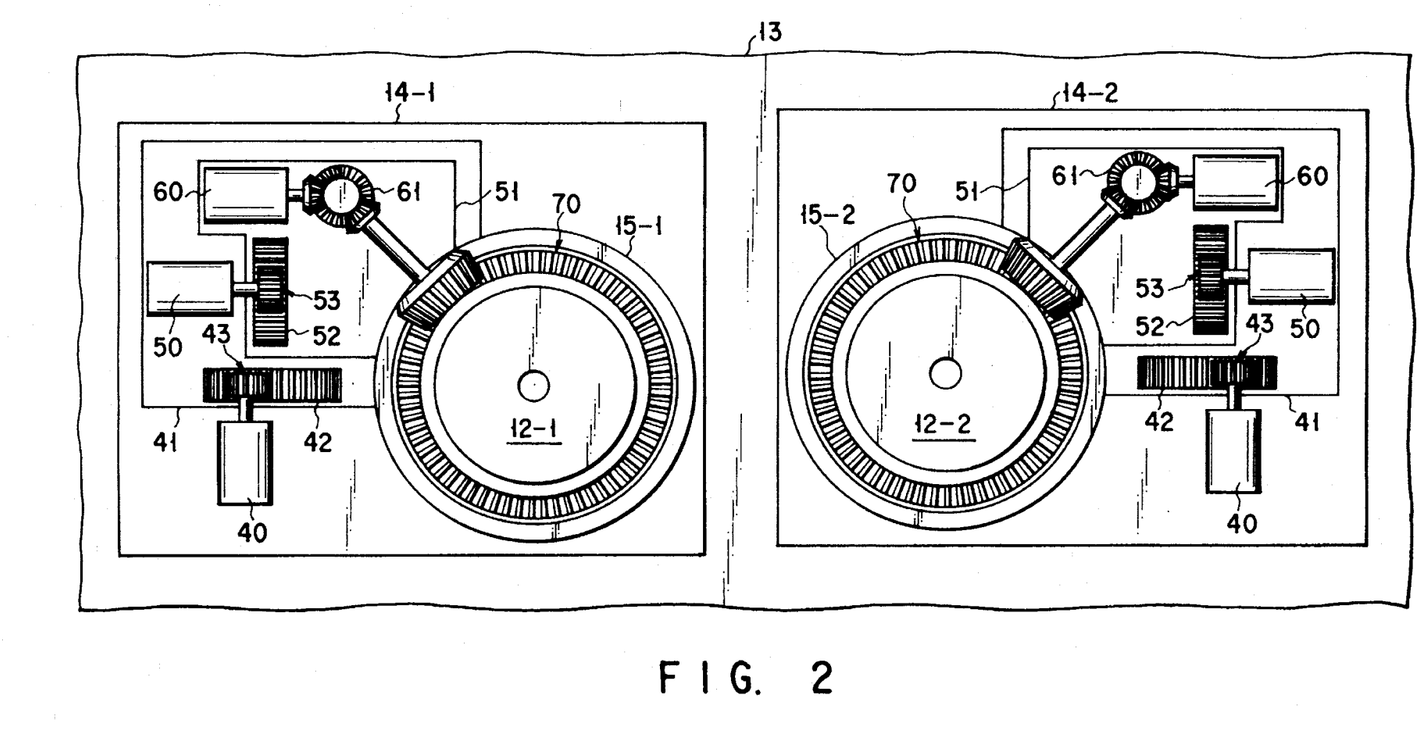
FIG. 2 is a plan view showing an installation section shown in FIG. 1.

FIG. 2 is a plan view specifically showing the installation sections 14-1 and 14-2. The installation section 14-2 has the same structure as that of the installation section 14-1. Therefore, the components common to both sections are denoted by the same reference symbols, and explanation will be made only to installation section 14-1.

As shown in FIG. 2, a Y-direction fine adjustment stepping motor 40 and a Y-stage 41 are provided on the installation section 14-1. The Y-stage 41 is equipped with a Y-direction rack 42. The motor 40 has a pinion 43 engaged with a Y-direction rack 42. An X-direction fine adjustment stepping motor 50 and an X-stage 51 are installed on the Y-stage 41. An X-direction rack 52 is provided on the X-stage 51. A pinion 53 of the motor 50 is engaged with an X-direction rack 52. A θ-direction fine adjustment stepping motor 60, an insert ring 15-1, and a bevel gear 61 for transferring a rotational movement to the insert ring are provided on the X-stage 51. The insert ring 15-1 is secured on the X-stage 51. A rotatable internal insert ring 70 is provided inside the insert ring 15-1. The internal insert ring 70 is a bevel gear which is connected to the bevel gear 61. A probe card 12-1 is installed on the internal insert ring 70.

In the next, a probing method using the above equipment will be explained.

Figure 3:
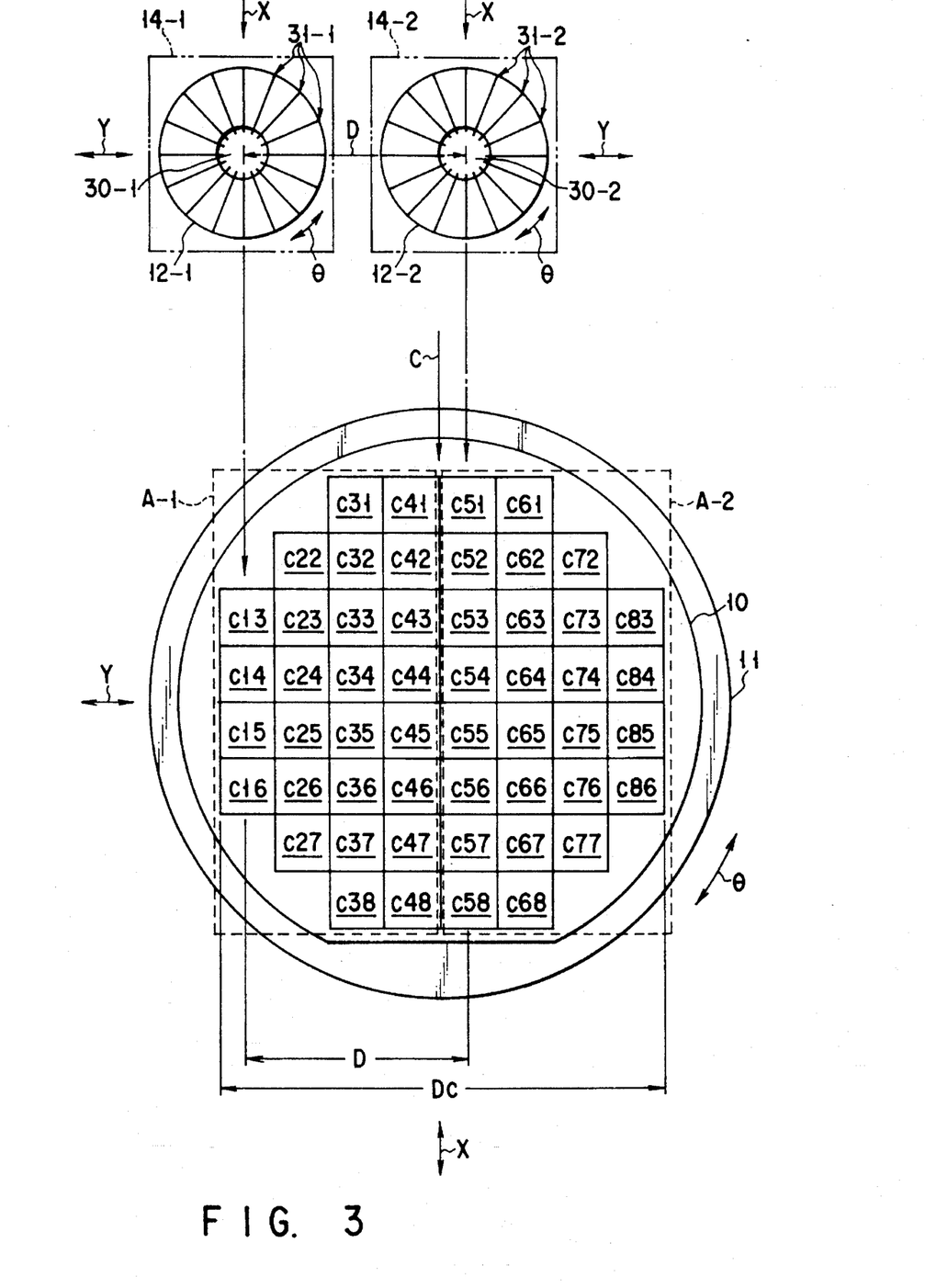
FIG. 3 is a view showing the positional relation between a probe card and a wafer.

At first, the wiring board 21 is inserted between the card holding section 13 and the main body 20, and the card holding section 13 is electrically connected with the main body 20. Then, the cards 12-1 and 12-2 are respectively attached to the insert rings 15-1 and 15-2. A pitch D between the insert rings 15-1 and 15-2 is adjusted in conformity with a chip disposal pattern of a wafer 10 to be tested, while moving the installation sections 14-1 and 14-2 in X- and Y-directions. FIG. 3 shows an example of a relation between the pitch D and the chip disposal pattern.

As shown in FIG. 3, opening portions 30-1 and 30-2 are respectively provided in the centers of the cards 12-1 and 12-2. Probe groups 31-1 and 31-2 are respectively projected from these opening portions 30-1 and 30-2, and these projecting portions are brought into electric contact with external terminals (or pads) of chips. In this embodiment, the pitch D is defined as a distance between the center points of the opening portions 30-1 and 30-2, and the center points of the opening portions 30-1 and 30-2 are assumed to conform with the center points of the chips. Chips c13 to c16, c22 to c27, c31 to c38, c41 to c48, c51 to c58, c61 to c68, c72 to c77, and c83 to c86 are formed and integrated on lines and rows constituting a matrix in the wafer 10. The equipment according to this embodiment recognizes the integrated chip groups as being divided into two areas A-1 and A-2 by a boundary indicated by a line C which separates the lines or rows into halves. The equipment simultaneously tests chips c13 to c16, c22 to c27, c31 to c38, and c41 to c48 by means of a card 12-1 as well as chips c51 to c58, c61 to c68, c72 to c77, and c83 to c86 by means of a card 12-2. To realize this measuring method, the pitch D stated above is set to about the half of the maximum width D of the chip groups, in this embodiment.

In the next, the wafer 10 is secured to the chuck 11. The wafer 10 is then moved to a position below the retaining section 13 while moving the chuck 11 in the X-, Y-, and θ-directions shown in FIG. 3. Further, the positions of the cards 12-1 and 12-2 are finely adjusted while moving the card installation sections 14-1 and 14-2 as well as the insert rings 15-1 and 15-2 in the X-, Y-, and θ-directions. As a result of this, the cards 12-1 and 12-2 are aligned with the chips formed on the wafer. Thereafter, the chuck 11 is moved in the Z-direction (i.e., the direction vertical to the paper face), thereby respectively bringing the probe groups 31-1 and 31-2, provided for the the cards 12-1 and 12-2, into contact with external terminals not shown of corresponding chips. A test pattern signal is then supplied from the main body 20 to one of the corresponding chips of the wafer 10 through the wiring board 21 and the probe card 12-1, and at the same time, this signal is also supplied to another one of the corresponding chips of the wafer 10 through the wiring board 21 and the prove card 12-2. Both of these chips outputs a signal responding to the test pattern signal. The signal outputted from the former chip is returned back to the main body 20 through the probe card 12-1 and the wiring board 21 and the signal outputted from the latter chip is returned back to the measuring body through the probe card 12-2 and the wiring board 21. A test result determination device provided in the main body 20 then determines whether these chips outputs proper signals or not.

Figure 4:
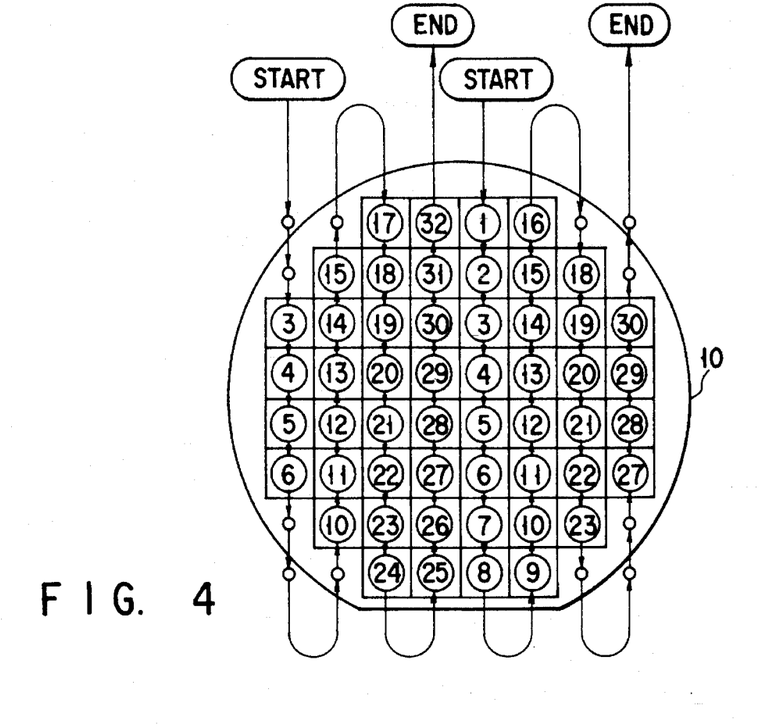
FIG. 4 is a view explaining a testing procedure.
Figure 5:
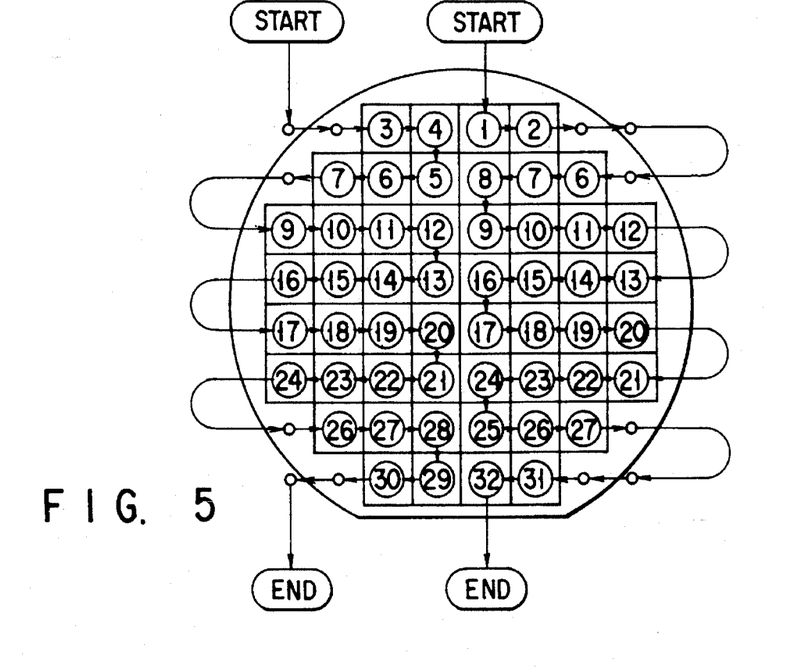
FIG. 5 is a view explaining another testing procedure.

The above operation is repeated in an movement direction as shown in FIG. 4 or 5, i.e., in the movement direction according to a step-and-repeat method. In FIGS. 4 and 5, numerals are indicated in a circle and these numerals denote the order of chips to be tested. Smaller circles in these figures denote portions which includes no corresponding chips, and therefore, no chip returns an output in these portions. In the example shown in FIG. 4, the third testing step is a testing step where two chips simultaneously return outputs for the first time. In this third testing step, outputs are supplied simultaneously from chips c13 and c53 shown in FIG. 3. Likewise, in the example shown in FIG. 5, two chips simultaneously return outputs for the first time in the sixth step. In this sixth step, outputs are supplied simultaneously from chips c32 and c72.

In both the examples shown in FIGS. 4 and 5, the total number of all chips is 52, and all the 52 pieces of chips integrated and formed in the wafer 10 are tested through 32 testing steps by probing them with use of two cards 12-1 and 12-2.

In the next, the size of a probe card will be explained.

Figure 6:
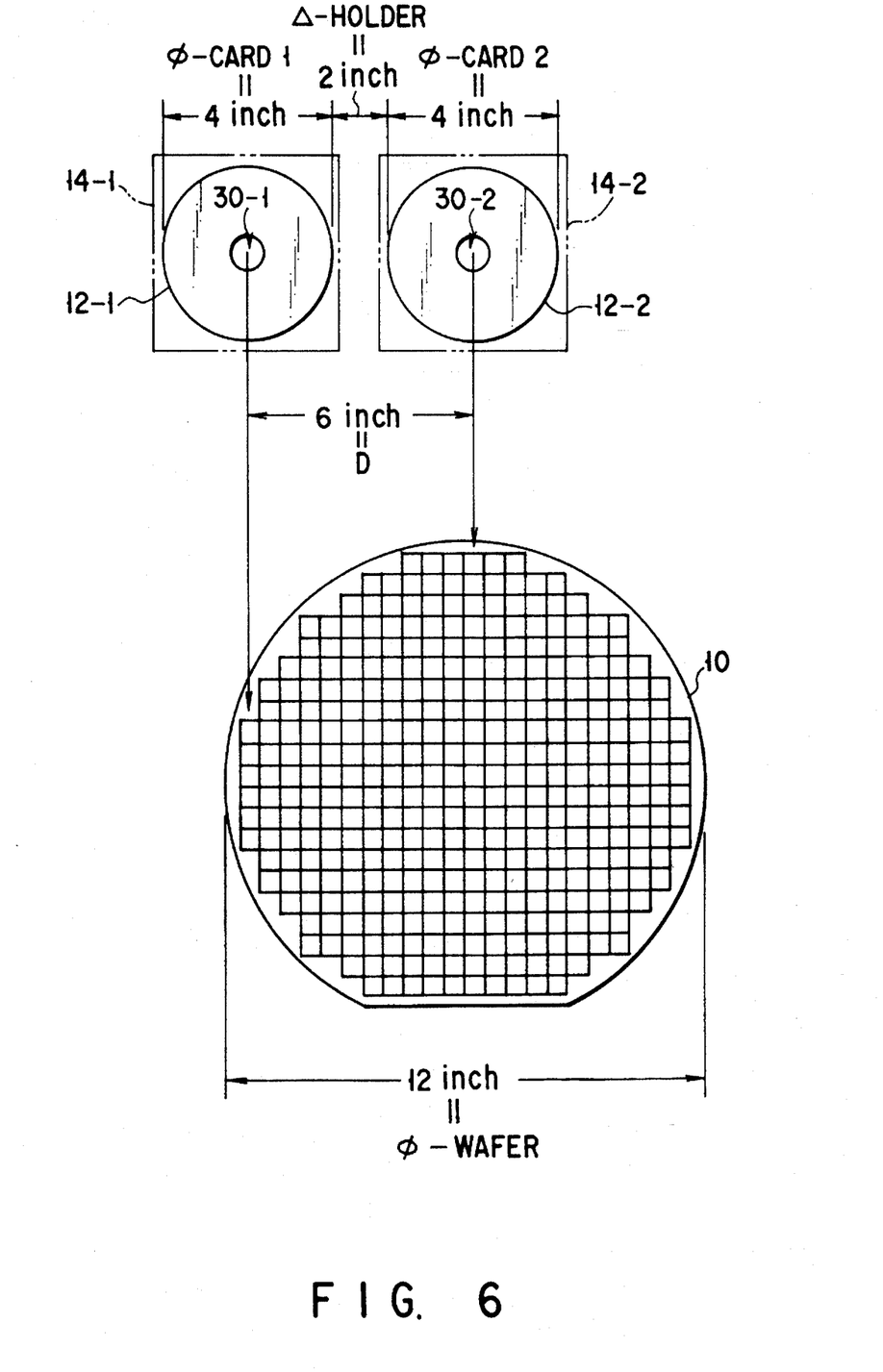
FIG. 6 is a view showing sizes of a probe card and a wafer.

FIG. 6 shows specific sizes of a probe card and a wafer.

A probe card has wiring groups connected to probe groups. A semiconductor device has an large number of pads which has been increased as a semiconductor device has been developed so as to execute higher functions. As the number of pads used in a semiconductor device is increased, the number of probes and the number of wirings used in a probe card must be increased. In view of these circumstances, it is difficult to reduced the diameter of a probe card to be smaller than four inches. If the size of a wiring group is reduced and intervals between wirings are reduced to attain high concentration, the diameter of a probe card can be reduced to be four inches or less. This method, however, ensures only poor reliability and is not practical from a view point of interferences (or cross-talks) occurring between wirings.

In the present invention, at least two probe cards are disposed. Therefore, the testing method shown in FIGS. 3 to 5 can be realized with a wafer having a 15 diameter of eight inches or more, supposing that a probe card has a diameter of four inches. This is because the pitch D can be set to four inches.

The pitch D, however, should desirably be set to at least five to six inches in view of the sizes of the installation sections 14-1 and 14-2. In FIG. 6, each of the probe cards 12-1 and 12-2 have a diameter of four inches, and the pitch D is set to six inches. In this state, there is a distance of two inches between the cards 12-1 and 12-2. This distance of two inches is enough to prevent the installation sections 14-1 and 14-2 from colliding into each other.

Therefore, as shown in FIG. 6, in order to effectively perform testing with use of the prober according to the present invention when a probe card having a diameter of four inches is used, it is desirable to use a wafer under test which has a diameter of twelve inches or more.

The relation between a probe card and a wafer under test will be expressed by the following inequality:

$$\phi\text{-WAFER} \geq (\phi\text{-CARD1} + \phi\text{-CARD2})/2 + \Delta\text{-HOLDER}$$

In this inequality, $\phi$-WAFER is a diameter of the wafer 10, $\phi$-CARD1 is a diameter of the card 12-1, $\phi$-CARD2 is a diameter of the card 12-2, and $\Delta$-HOLDER is a distance between the cards 12-1 and 12-2 (i.e., a distance as a margin for preventing the installation sections 14-1 and 14-2 from colliding into each other).

Figure 7:
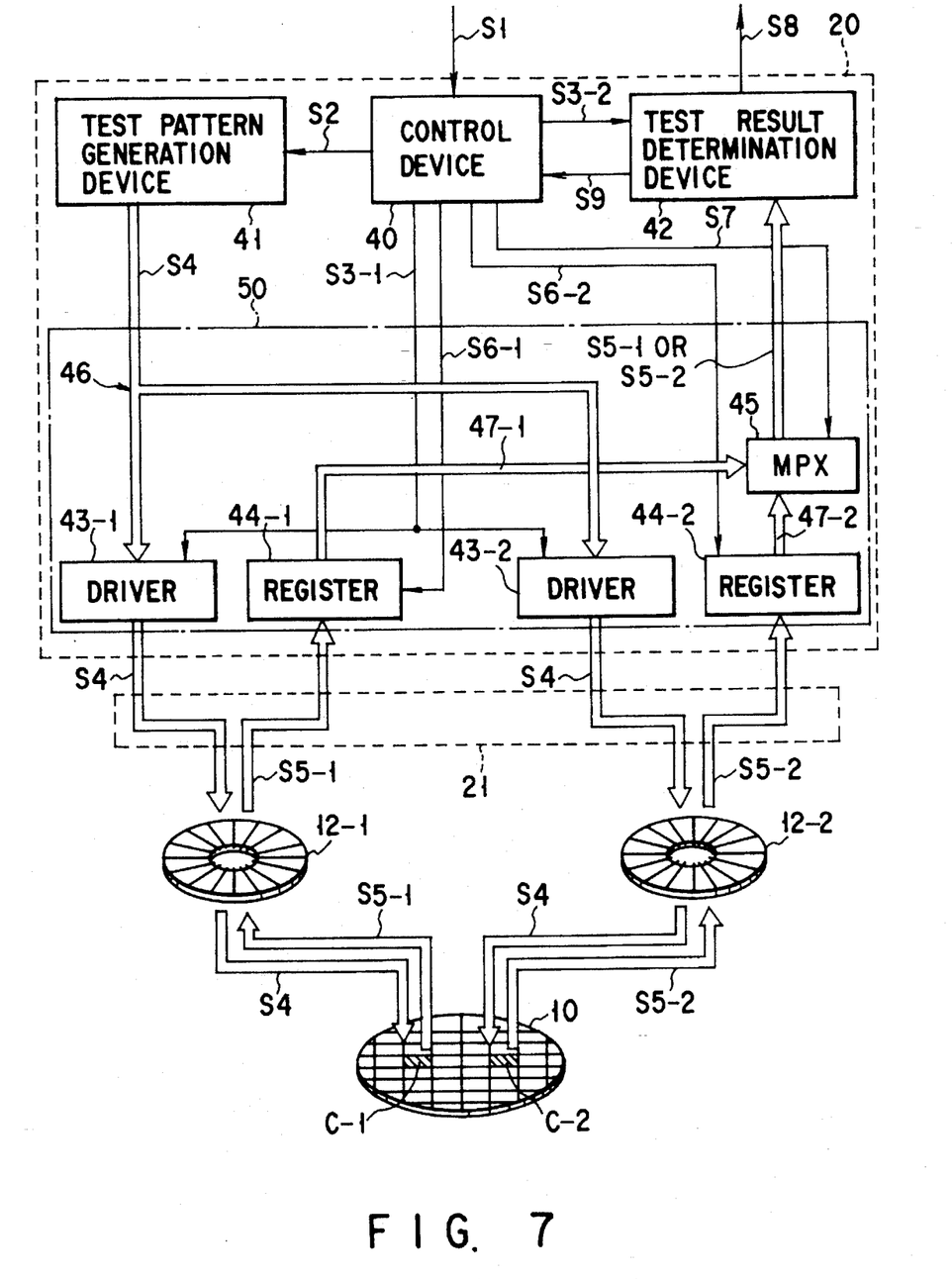
FIG. 7 is a view showing the structure of a system included in a main body of a test equipment according to the embodiment of the present invention.

FIG. 7 shows a structure of a system included in a main body of a test equipment according to an embodiment of the present invention.

As shown in FIG. 7, a control device 40 for controlling the system is provided in a main body 20. The control device 40 controls a test pattern signal generation device 41, a test result determination device 42, chip driver circuits 43-1 and 43-2 provided respectively for two cards 12-1 and 12-2, register circuits 44-1 and 44-2, and a multiplexer 45 for multiplexing signals outputted from the two register circuits 44-1 and 44-2, at operation timings.

At first, in response to an input of a measurement start signal S1, the control device 40 is activated and outputs a control signal S2 for the generation device 41, a signal S3-1 for activating the chip driver circuits 43-1 and 43-2, and a signal S3-2 for activating the determination device 42. When the control signal S2 is inputted into the generation device 41, the generation device 41 outputs a test pattern signal S4. This signal S4 is diverged at a diverging point 46 and is inputted into two chip driver circuits 43-1 and 43-2 at a substantially equal timing. The chip driver circuits 43-1 and 43-2 respectively drive a chip c-1 and another chip c-2. The driver circuits 43-1 and 43-2 respectively supply power sources for the chips c-1 and c-2 or adjust timings of supplying test pattern signals S4. The test pattern signals S4 outputted through the driver circuits are respectively supplied chips c-1 and c-2 through the circuit board 21 and the cards 12-1 and 12-2. The chips c-1 and c-2 receive the test pattern signals S4 as inputs, and respectively output chip output signals S5-1 and S5-2 responding to the inputs. The chip output signal S5-1 is fed through the card 12-1 and the circuit board 21 and is temporarily contained into the register 44-1. At the substantially same time, the other chip output signal S5-2 is temporarily contained into the register 44-2. The chip output signals S5-1 and S5-2 are thus contained into the registers 44-1 and 44-2 in order to allow either one of the chip output signals of the chips c-1 and c-2 to have a priority. If the output signal S5-1 from the chip c-1 has a priority, the control device 40 outputs a signal S6-1 for supplying an instruction to the register 44-1 so as to output data contained therein, and simultaneously, supplies a multiplexer 45 with a signal S7 for selecting a bus 47-1. As a result of this, the output signal S5-1 of the chip c-1 contained in the register 44-1 is outputted and then inputted into the determination device 42 through the multiplexer 45. Further, on the basis of the determination result, the determination device 42 outputs a signal S8 expressing whether the chip is normal or defective. During this operation, the output signal S5-2 is kept maintained in the other register 44-2. Upon completion of test of the chip c-1, the determination device 42 outputs a signal S9 notifying the completion of the test to the control device 40. On the basis of the signal S9, the control device 40 supplies the register 44-2 with a signal S6-2 which instructs the register 44-2 so as to output data contained therein, and simultaneously supplies the register 44-2 with a signal for selecting a bus 47-2 (which is a inverse signal of the signal S7). As a result, the output signal S5-2 of the chip c-2 contained in the register 44-2 is outputted into the determination device 42 through the multiplexer 45. Then, on the basis of the test results, the determination device 42 outputs a signal expressing whether the chip is normal or defective, as in the case of the chip c-1. Upon completion of test of both of the two chips c-1 and c-2, the control device 40 repeats the above operation again.

Although outputs from chips are processed by the multiplexer 45 in the above embodiment, another method may be adopted in which registers 44-1 and 44-2 are directly connected to the determination device 42 and determination is simultaneously made as to whether chips are normal or defective by the determination device 42.

In the probing equipment according to the above embodiment, two or more probe cards are simultaneously used to test one wafer, and therefore, the number of chips which can be tested at the same time is increased. As a result, an advantage is obtained in that the processing time per wafer is shortened so that the wafer processing ability on time base is improved. This advantage is remarkably effective when using a wafer having an enlarged diameter and an increased number of integrated chips. Specifically, processing is effectively performed when a wafer has a diameter of twelve inches or more.

Figure 8:
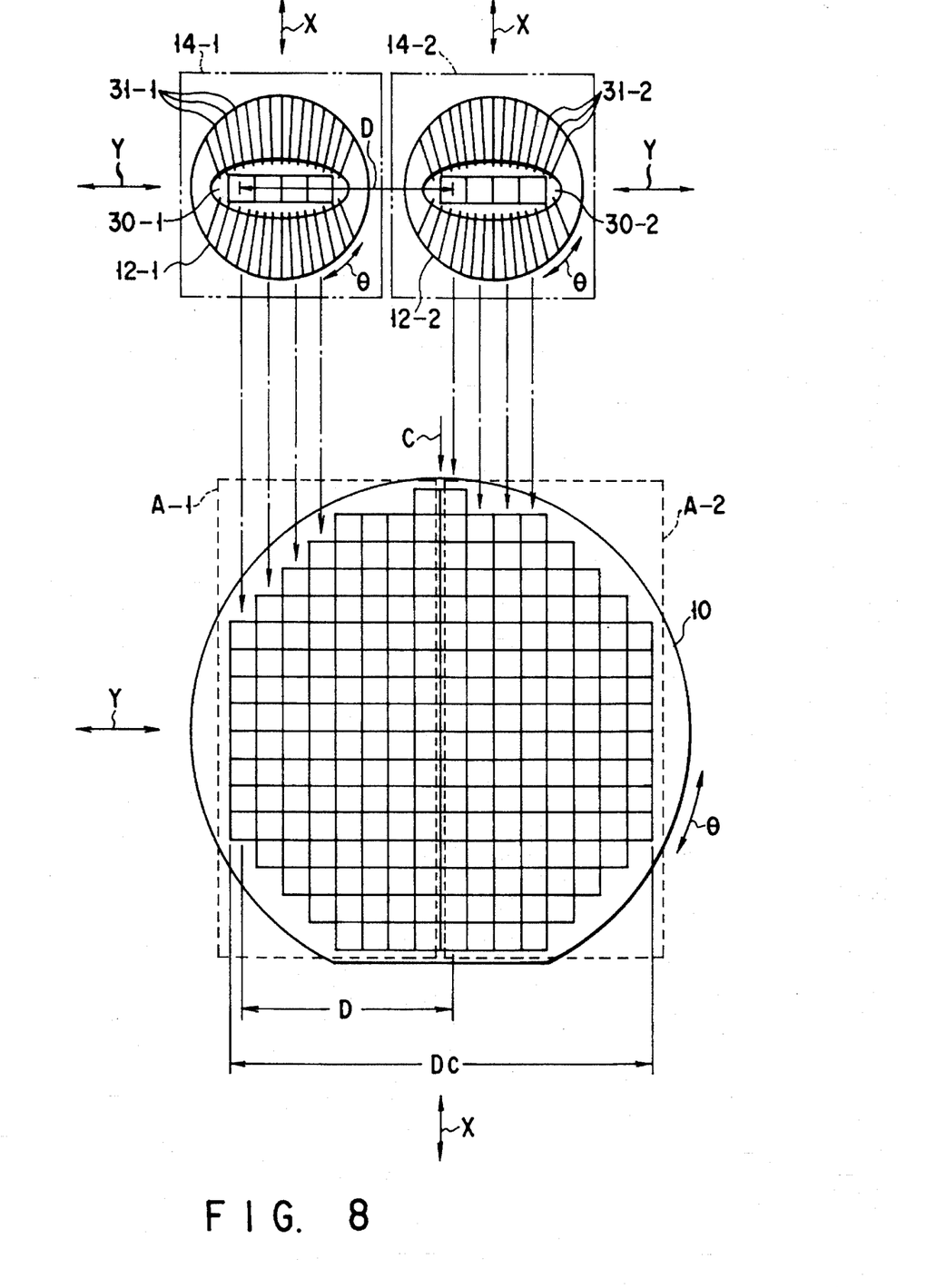
FIG. 8 is a view showing a state where the present invention is practiced in a card of a multi-probing method.

The above embodiment deals with an example in which one probe section is provided per one probe card. However, it is possible to adopt a multi-probing method in which a plurality of prove sections are provided so that a plurality of chips can be simultaneously tested, as shown in FIG. 8. In this case, even if a card is subjected to limitations as to the number of probes, the processing ability can be multiplied twice since two probe cards are simultaneously used.

Also, the above embodiment has been explained as an example where one test station is used. In case of thus using one test station, the processing ability can be multiplied twice without substantially increasing the factory space occupied by the equipment, in comparison with a conventional equipment using one test station.

Otherwise, a multi-test-station method of providing a plurality of test stations may be adopted in present invention. Since a conventional equipment using a multi-test-station is expensive, the processing ability is not always excellent in relation to the price of the equipment. However, if the above embodiment is modified so as to adopt the multi-test-station method, the number of chips which can be processed simultaneously can be much more increased than in case of a conventional equipment using this method, so that such a modified embodiment achieve an excellent processing ability relative to the price of the equipment, in contrast to the conventional equipment.

In the equipment according to the above embodiment, the installation sections 14-1 and 14-2 can independently be moved in X- and Y-directions, so that the card pitch D can be adjusted in conformity with diameters of wafers or sizes of integrated LSI chips. In addition to movements as stated above, the insert rings 15-1 and 15-2 can be independently moved in the θ-direction, so that the cards 12-1 and 12-2 individually can be aligned with chips or a wafer. Therefore, alignment accuracy can be improved in comparison with cards using a multi-probing method. For example, in a card using a multi-probing method of simultaneously testing a number of chips, e.g., four or eight chips, the card must have a larger diameter so that large errors in positions of probes or erroneous installation may occur due to deformation of a card or an inclination of the card when installed. The upper limit of the card diameter which can effectively eliminate those errors is estimated to be about eight inches.

In this respect, according to the present invention, the card diameter can be sufficiently reduced to a small value, e.g., eight inches or less even if two or four cards are simultaneously used to measure four or eight chips at the same time without deteriorating the processing ability. Therefore, errors in positions of probes can be reduced or erroneous installation can be eliminated. Further, since cards are individually aligned with chips (or a wafer), the errors or erroneous installation can be corrected with ease. These improvements in the alignment accuracy are particularly effective when probing chips adopting a small pitch between external terminals.

In addition, in the equipment according to an embodiment of the present invention, groups of integrated chips are recognized as being divided into two areas A-1 and A-2 by a boundary separating lines or rows into halves. Testing is simultaneously performed on two areas by using one card for each of areas A-1 and A-2. Since chip groups are thus divided and tested, chips are prevented from being tested twice, so that the processing ability is improved.

Further, in the equipment according to an embodiment, a test pattern outputted from a test pattern generation device is diverged and distributed simultaneously to a plurality of chip driver circuits. The test pattern is inputted into a plurality of chips at the substantially same time by a plurality of chip driver circuits, and further, a plurality of registers are provided so that signals outputted from chips are temporarily contained into the registers, respectively. Then, in accordance with priorities of the signals, the signals are supplied one by one to a determination device. This structure is not necessary when signals from a large number of chips can be processed by the determination device. However, in case of using a determination device capable of processing only one signal at once, the total processing time can be shortened because it is necessary to continuously repeat an operating procedure of generation, transmission, and receipt, such as generation of a test pattern to transmission thereof to receipt of an output signal then to generation of a test pattern to transmission thereof to receipt of an output signal.

If this system as illustrated in the dashed line frame 50 in FIG. 7 is installed between a test head and a main body or is used as an optional interface device, an existing conventional main body of a test equipment can be used, so that a large amount of equipment investment can be saved advantageously.

Figure 9:
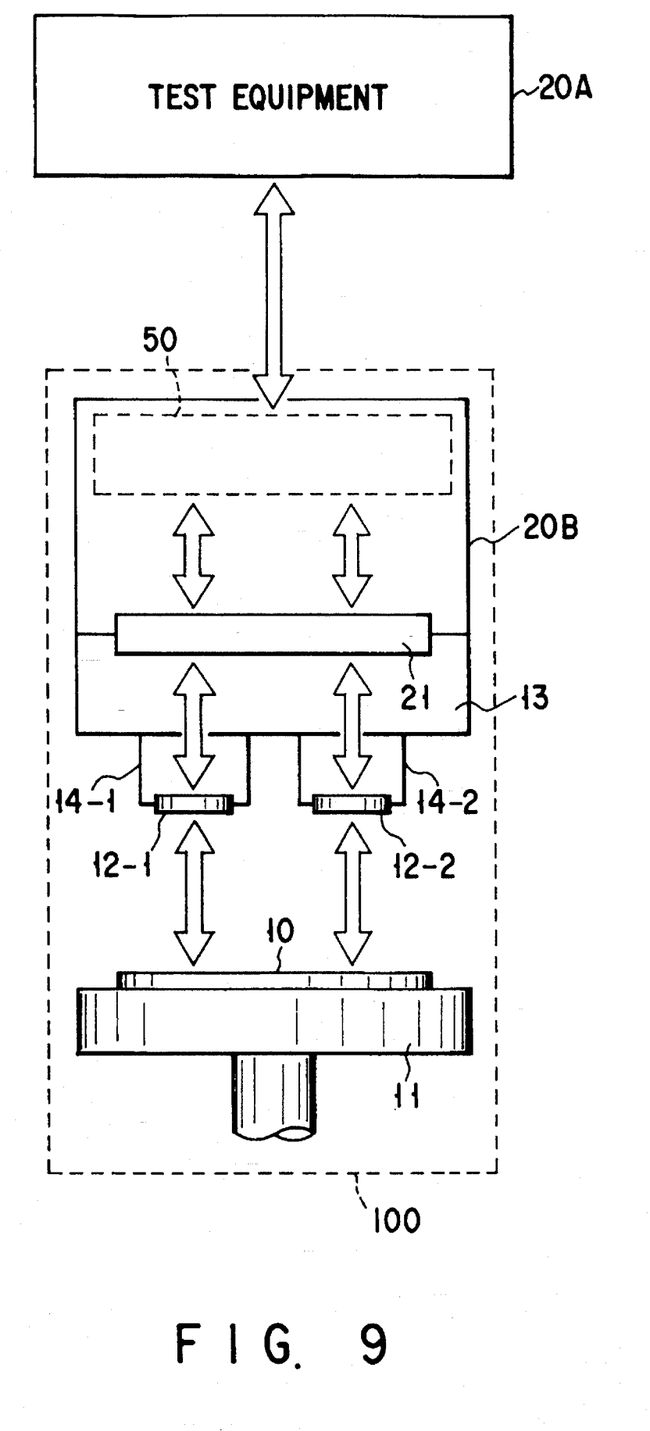
FIG. 9 is a block diagram showing a state where a wafer prober according to the present invention is connected to a conventional main body of a test equipment by an interface device.
Figure 10:
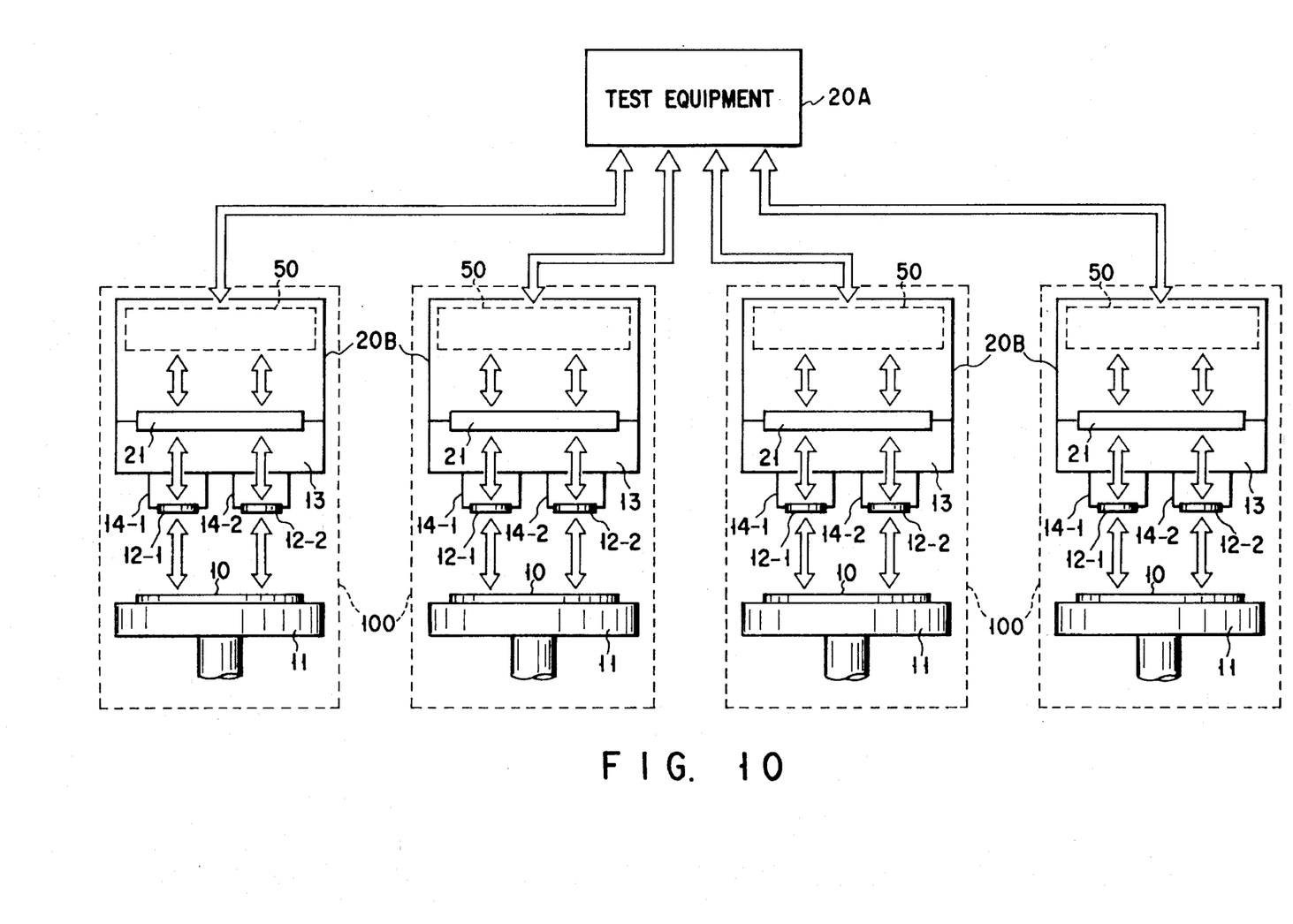
FIG. 10 is a block diagram showing a state where a wafer prober according to the present invention is connected to another conventional main body of a test equipment by an interface device.

FIGS. 9 and 10 are block diagrams showing the states where a conventional main body of a test equipment is connected to a wafer prober according to the present invention by an interface device.

FIG. 9 shows a conventional method using one test station 100. FIG. 10 shows a multi-test-station method using a plurality of test stations 100. In these figures, the reference 20A denotes the conventional measuring main body, and the reference 20B denotes an interface device including a circuit 50.

As has been explained above, according to the present invention, it is possible to provide a proving equipment and a probing method at a low price with a high processing ability.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A wafer prober comprising:
    a wafer chucking device for chucking a semi-conductor wafer in which integrated circuit chips are arranged in a matrix;
    a probe card holding device for holding two or more probe cards; and
    a test device for simultaneously testing a plurality of chips in one wafer with use of the two or more probe cards, while respectively making probes included in the two or more probe cards be in contact with external terminals of the plurality of chips.

2. A wafer prober according to claim 1, wherein the probe card holding device includes two or more installation sections in which the probe cards are installed, and two or more pin groups electrically connected to the terminals of the probe cards.

3. A wafer prober according to claim 2, wherein the two or more installation sections respectively include insert rings to which the probe cards are attached.

4. A wafer prober according to claim 3, wherein the insert ring respectively include internal insert rings into which "the probe cards are inserted and said insert rings is rotated.

5. A wafer prober according to claim 2, wherein the two or more installation sections are independently moved in X- and Y-directions.

6. A wafer prober according to claim 5, wherein each of the two or more installation sections includes an adjustment device for performing a fine adjustment in the X-direction, an adjustment device for performing a fine adjustment in the Y-direction, and an adjustment device for performing a fine adjustment in a θ-direction.

7. A wafer prober according to claim 6, wherein the two or more installation sections respectively insert rings into which the probe cards are inserted, said insert rings including internal insert rings which are rotated by the adjustment device for performing the fine adjustment in the θ-direction, and said probe cards being attached to the internal insert rings.

8. A wafer prober according to claim 2, wherein a relation between the probe cards and the wafer to be tested satisfies an inequality as follows:

$$\phi\text{-WAFER} \geq (\phi\text{-CARD1} + \phi\text{-CARD2})/2 + \Delta\text{-HOLDER}$$

wherein the φ-WAFER is a diameter of the wafer, the φ-CARD1 is a diameter of one of the probe card, the φ-CARD2 is a diameter of another one of the probe card, and Δ-HOLDER is a distance between both of the probe cards, the Δ-HOLDER is a distance as a margin for preventing the installation sections from colliding into each other.

9. A wafer prober according to claim 8, wherein the diameter of the wafer to be tested is twelve inches or more.

10. A wafer prober according to claim 9, wherein the diameter of each of the probe cards is four or inches or more and less than eight inches.

11. A probing method comprising steps of:

chucking a semiconductor wafer in which integrated circuit chips are arranged in a matrix, by a wafer chucking device;

holding two or more probe cards by a probe card holding device; and respectively making probes included in the two or more probe cards be in contact with external terminals of the chips, and simultaneously testing a plurality of chips in one wafer with use of the two or more probe cards.

* * * * *